United States Patent [19]

Dorais

[11] 4,188,549
[45] Feb. 12, 1980

[54] ACOUSTICALLY RESPONSIVE SENSOR SWITCH

[75] Inventor: Mark V. Dorais, Detroit, Mich.

[73] Assignee: Federal Screw Works, Detroit, Mich.

[21] Appl. No.: 850,666

[22] Filed: Nov. 11, 1977

[51] Int. Cl.² ............................................. H03K 3/26
[52] U.S. Cl. ............................. 307/308; 179/1 VC; 328/1; 340/148
[58] Field of Search ......................... 307/308; 328/1; 361/182; 179/1 VC, 1 AL; 340/148; 325/382; 73/647

[56] References Cited
U.S. PATENT DOCUMENTS

| 3,573,724 | 4/1971 | Komorida | 340/148 |
| 3,748,496 | 7/1973 | Hedin et al. | 179/1 VC |
| 3,892,133 | 7/1975 | Quinn | 73/647 |
| 4,110,725 | 8/1978 | Petrosky | 340/148 |

Primary Examiner—Stanley D. Miller, Jr.
Assistant Examiner—B. P. Davis
Attorney, Agent, or Firm—Harness, Dickey & Pierce

[57] ABSTRACT

A miniaturized acoustically responsive sensor switch that is responsive to localized acoustic sounds including a transducer and a conditioning circuit that is adapted to convert the audio signal produced by the transducer in response to the detection of an acoustic sound into a single output pulse.

4 Claims, 4 Drawing Figures

ACOUSTICALLY RESPONSIVE SENSOR SWITCH

BACKGROUND AND SUMMARY OF THE INVENTION

The present invention relates to an acoustically responsive sensor switch that is particularly suited for use, as a throat pickup switch for example, by physically handicapped persons to permit such persons to operate devices that are adapted to be responsive to a single input signal.

With the increased development of devices which allow physically impaired persons to perform various tasks which previously required the assistance of an aide, the need has arisen for the development of a sensor switch which can be actuated by even the most severely handicapped individuals with a simple body function. Many devices which require normal motor capabilities to operate, can be adapted to function in response to a single input signal. Accordingly, it is the purpose of the present invention to provide a sensor switch that will permit a physically handicapped individual to operate such devices. A typical application of the present invention would be as a throat pickup switch that is actuable by a grunt or hum.

Basically, the present invention comprises a transducer that is adapted to produce an electrical signal in response to the detection of a localized acoustical sound, and a conditioning circuit that is adapted to convert the audio signal from the transducer into a single square-wave pulse. Since the audio signal produced by the transducer will typically comprise a damped sinusoidal waveform, it is desirable that the conditioning circuit convert the audio signal to a simple ON/OFF signal which is better suited for switching purposes. In the preferred embodiment, this is accomplished by providing the audio signal through a threshold comparator circuit to a "debounce" circuit which has a response time slower than the frequency of the audio signal. The output signal therefrom is then provided to a Schmitt trigger circuit having preselected turn-on and turn-off thresholds which cause the circuit to produce a single square-wave output signal that coincides approximately with the duration of the acoustic sound.

Additional objects and advantages of the present invention will become apparent from a reading of the detailed description of the preferred embodiment which makes reference to the following set of drawings in which:

DETAILED DESCRIPTION OF THE PREFERRED EMBODIMENT

The present invention comprises in general a transducer that is adapted to be responsive to localized acoustic sounds and a conditioning circuit connected to the transducer that is adapted to convert the audio signal from the transducer into a single square-wave output pulse. The invention is particularly suited for use as a sensor switch by physically handicapped individuals to permit operation by such individuals of devices that are responsive to a single input signal; as for example, the portable voice system described in copending U.S. application, "Portable Voice System for the Verbally Handicapped", Ser. No. 850,669, filed Nov. 11, 1977. Specifically, the present invention can be utilized as a blow switch that is actuated by the breath, or a throat switch that is actuated by grunts or hums. Similarly, the transducer of the present device can be placed on any surface and respond to the sound of an object, such as a hand or foot, striking the surface.

Figure 1:
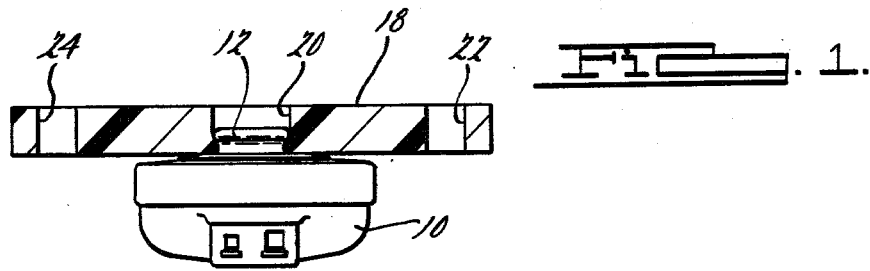
FIG. 1 is a view of the transducer utilized in the preferred embodiment of the present invention shown affixed to a mounting plate.
Figure 2:
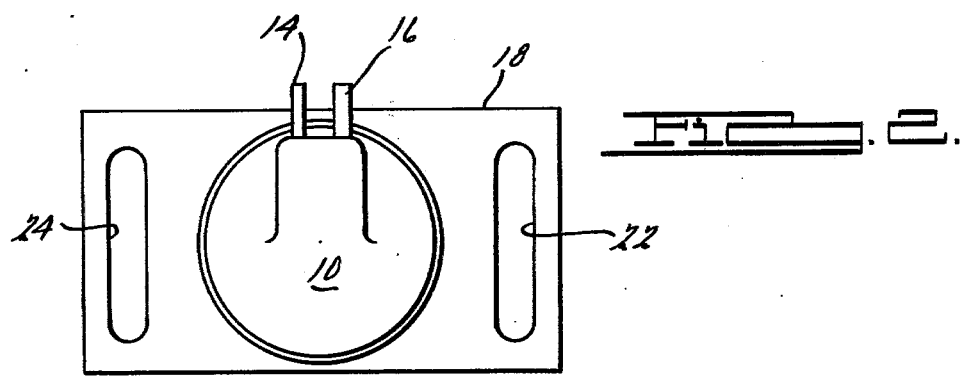
FIG. 2 is another view of the transducer affixed to the mounting plate.

Referring to FIGS. 1 and 2, a transducer 10 of the type contemplated by the present invention is shown. The particular transducer utilized in the preferred embodiment comprises a miniature receiver manufactured by Telex Communications, Inc., manufacturing No. RTV-04. Although sold primarily as a receiver, the transducer 10 functions also in the reverse mode as a microphone, the purpose for which it is used herein. Extending from the backside of the transducer 10 is a small protrusion 12 which acts as an acoustic passage to transmit or receive acoustical energy. The transducer 10 is shown in FIGS. 1 and 2 secured to a mounting plate 18 having a pair of elongated slots 22 and 24 formed at each end. The protrusion 12 of the transducer 10 is adapted to be snap-fitted into a hole 20 formed in the center of the mounting plate 18. Secured in this manner, the transducer 10 can then be utilized as a throat pickup sensor, for example, by fastening the assembly to the throat with a strap that is passed through slots 22 and 24 and secured around the throat so that the opening 20 is positioned adjacent the vocal chords. In this manner, an acoustical sound emitted from the throat, such as grunt or hum, will be detected by the transducer 10 and converted to an electrical signal that is provided on output lines 14 and 16. Of course, any manner of mounting device can be utilized to suit the particular application.

The audio signal generated by the transducer 10 in response to the detection of an acoustical sound may take on a variety of waveform shapes. However, regardless of the particular audio signal generated, it is desirable to produce a single output pulse in response to each acoustic sound. Thus, regardless of whether the acoustic sound detected by the transducer 10 is a brief grunt or a more sustained hum, a single output pulse should be generated.

Figure 3:
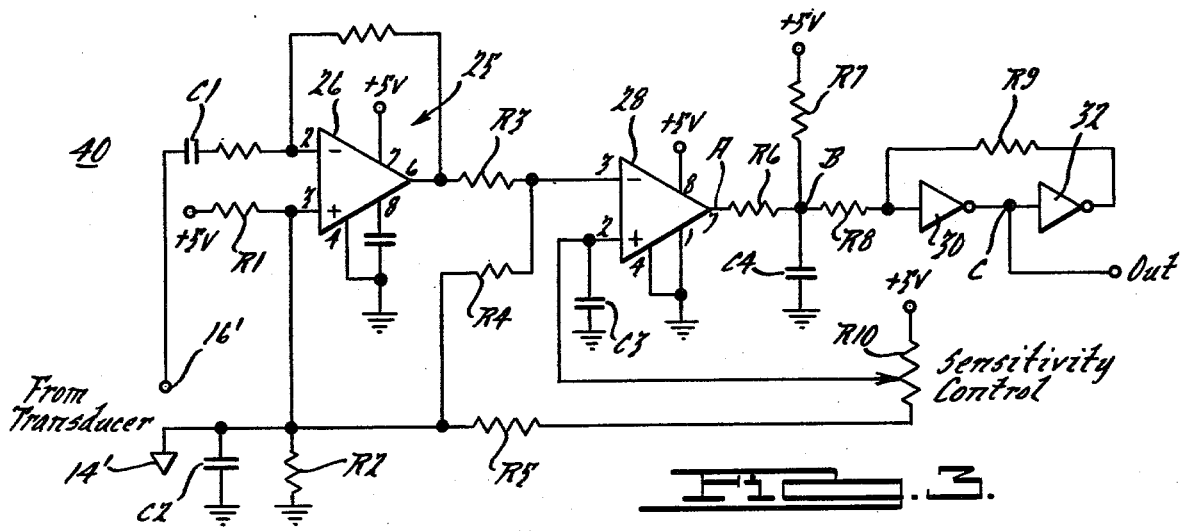
FIG. 3 is a circuit diagram of the conditioning circuit of the present invention.

In order to accomplish this, the audio signal from the transducer 10 is provided to a conditioning circuit 40 illustrated in FIG. 3. The two output lines 14 and 16 from the transducer 10 are connected to input terminals 14' and 16', respectively. The pseudoground terminal 14' is tied to absolute ground through a capacitor C2, and the signal input terminal 16' is a.c. coupled through capacitor C1 to a high gain amplifier circuit 25. The high gain amplifier circuit 25 comprises an operational amplifier 26 having its positive input terminal tied to a +5 v source through a voltage divider network comprised of resistors R1 and R2. The values of resistors R1 and R2 are selected so that an approximately 2.5 volt reference signal is provided to the positive input of operational amplifier 26, which serves as a reference level about which the incoming audio signal at terminal 16' will swing.

Figure 4:
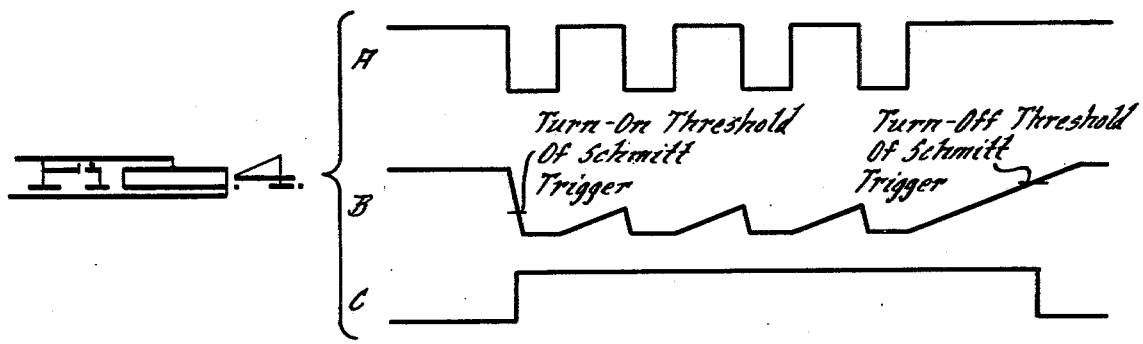
FIG. 4 is a signal diagram illustrating the waveforms of the signals present at various identified locations in the circuit shown in FIG. 3.

The amplified audio signal from the output of high gain amplifier circuit 25 is provided through another voltage divider network, comprised of resistor R3 and the series combination of resistors R2 and R4, to the negative input of a comparator amplifier 28. The magnitude of the threshold signal provided to the positive input of comparator amplifier 28 is controlled by the setting of a potentiometer R10, which comprises the upper half of another voltage divider network including resistors R2 and R5. The output of comparator amplifier 25 at point A is normally HI. However, when the magnitude of the amplified audio signal provided to the negative input of comparator amplifier 28 exceeds the level of the threshold signal provided to its positive input, the output of comparator amplifier 28 will go LO. Accordingly, for a given audio signal, which typically comprises a damped sinusoidal waveform, the output of comparator amplifier 28 at point A will appear as a plurality of relatively closely spaced negative square-wave pulses, as shown in the signal diagram in FIG. 4. The frequency of the square-wave output signal from comparator amplifier 28 will, of course, be equivalent to the frequency of the incoming audio signal. Since the setting of potentiometer R10 determines the magnitude of the threshold signal provided to the positive input of comparator amplifier 28, it can be seen that potentiometer R10 controls the sensitivity of the conditioning circuit 40.

The output signal from comparator amplifier 28 is provided to a "debounce" circuit comprised of resistors R6 and R7 and capacitor C4, which effectively integrates the square-wave signal appearing at point A. The value of resistor R6 is selected to be substantially less than the value of resistor R7, so that when the output of comparator amplifier 28 switches from its normally HI state to its LO state, the charge on capacitor C4 will rapidly discharge through resistor R6. However, due to the substantially larger value of resistor R7, when the output of comparator amplifier 28 returns to its HI state, capacitor C4 will charge at a much slower rate through resistor R7. Thus, the output from the debounce circuit at node B will appear similar to that illustrated in the signal diagram of FIG. 4.

The output signal from the debounce circuit is provided to a Schmitt trigger circuit including inverters 30 and 32, and resistors R8 and R9. When the magnitude of the signal from the output of the debounce circuit at node B drops below a first turn-on threshold established by the value of resistor R8 relative to resistor R9, the output from the Schmitt trigger circuit at node C will go HI. In addition, when the magnitude of the signal at node B increases above a second turn-off threshold level established by the value of resistor R9 relative to resistor R8, which is greater than the first predetermined threshold level, the output from the Schmitt trigger circuit at node C will go LO. Accordingly, as can be seen from the signal diagram illustrated in FIG. 4, the value of resistor R7 in the debounce circuit is selected to provide a sufficiently slow charge time for capacitor C4 such that, given the frequency of the square-wave output signal from comparator amplifier 28, the magnitude of the signal at node B will not exceed the turn-off threshold of the Schmitt trigger circuit until after the last negative pulse produced in response to the incoming audio signal. Additionally, the value of resistor R7 is selected so that the charge time of capacitor C4 will be sufficiently fast to permit the conditioning circuit 40 to distinguish between two closely spaced audio signals. In the preferred embodiment, the frequency response of the circuit 40 is selected to be between approximately 85 Hz. and 200 Hz.

While the above description constitutes the preferred embodiment of the invention, it will be appreciated that the invention is susceptible to modification, variation and change without departing from the proper scope or fair meaning of the accompanying claims.

What is claimed is:

1. An acoustically responsive sensor switch comprising:
   transducer means for detecting a localized acoustic sound and producing an electrical audio signal in response thereto; and
   circuit means connected to said transducer means for producing a switching signal in response to said audio signal including magnitude comparator means for comparing the magnitude of said audio signal with the magnitude of a threshold signal and producing a square-wave output signal, integrator means having a response time greater than the duration of a single pulse of said square-wave signal connected to said comparator means for integrating said square-wave signal, and trigger circuit means connected to said integrator means for producing an output signal that is initiated when the magnitude of said integrated signal decreases below (exceeds) a predetermined turn-on level and is terminated when the magnitude of said integrated signal exceeds (decreases below) a predetermined turn-off level greater (less) than said predetermined turn-on level.

2. The sensor switch of claim 1 further including sensitivity control means for controlling the sensitivity of said sensor switch by varying the magnitude of said threshold signal.

3. The sensor switch of claim 1 wherein said integrator means includes a capacitor, discharging means for rapidly discharging said capacitor when said square-wave signal switches from a first level to a second level, and charging means for charging said capacitor at a relatively slow rate when said square-wave signal switches from said second level to said first level.

4. The sensor switch of claim 3 wherein said charging means is adapted to charge said capacitor at a rate that will not permit said capacitor to attain a level of charge greater than said predetermined turn off level of said trigger circuit means in the period of time corresponding to the duration of a single pulse of said square-wave signal.

* * * * *